(12) United States Patent
Liu

(10) Patent No.: US 11,985,818 B2
(45) Date of Patent: May 14, 2024

(54) ANTI-FUSE DEVICES AND ANTI-FUSE UNITS

(71) Applicant: CHANGXIN MEMORY TECHNOLOGIES, INC., Anhui (CN)

(72) Inventor: ChihCheng Liu, Hefei (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 448 days.

(21) Appl. No.: 17/310,896

(22) PCT Filed: Mar. 24, 2021

(86) PCT No.: PCT/CN2021/082650
§ 371 (c)(1),
(2) Date: Aug. 27, 2021

(87) PCT Pub. No.: WO2021/203969
PCT Pub. Date: Oct. 14, 2021

(65) Prior Publication Data
US 2022/0320122 A1    Oct. 6, 2022

(30) Foreign Application Priority Data
Apr. 8, 2020 (CN) .......................... 202010268401.0

(51) Int. Cl.
*H10B 20/20* (2023.01)
*G11C 29/00* (2006.01)

(52) U.S. Cl.
CPC ........... *H10B 20/20* (2023.02); *G11C 29/702* (2013.01); *G11C 29/812* (2013.01); *G11C 2229/763* (2013.01)

(58) Field of Classification Search
CPC ....... H10B 20/20; H10B 12/30; H01L 23/525; H01L 23/5252; H01L 27/0688; G11C 29/702; G11C 29/812; G11C 2229/763; G11C 17/16
See application file for complete search history.

(56) References Cited

U.S. PATENT DOCUMENTS

| 8,933,492 B2 | 1/2015 | Kurjanowicz |
| 8,975,724 B2 | 3/2015 | Park et al. |
| 9,490,333 B2 | 11/2016 | Park |
| 9,530,460 B2 | 12/2016 | Chen et al. |

(Continued)

FOREIGN PATENT DOCUMENTS

| CN | 103531589 A | 1/2014 |
| CN | 109390317 A | 2/2019 |

(Continued)

OTHER PUBLICATIONS

CN first office action in Application No. 202010268401.0, dated May 26, 2023.

(Continued)

*Primary Examiner* — Allison Bernstein
*Assistant Examiner* — Margaret B Hayes
(74) *Attorney, Agent, or Firm* — Syncoda LLC; Feng Ma

(57) ABSTRACT

An anti-fuse device includes: a substrate; an anti-fuse gate, partially embedded in the substrate, a portion of the anti-fuse gate embedded in the substrate having one or more sharp corners; and an anti-fuse gate oxide layer, located between the anti-fuse gate and the substrate.

18 Claims, 3 Drawing Sheets

(56) References Cited

U.S. PATENT DOCUMENTS

| | | | |
|---|---|---|---|
| 10,236,249 B2 | 3/2019 | Lee | |
| 10,446,562 B1 * | 10/2019 | Horch | G11C 7/12 |
| 2004/0041167 A1 | 3/2004 | Marr et al. | |
| 2006/0263946 A1 | 11/2006 | Kreipl | |

FOREIGN PATENT DOCUMENTS

| | | |
|---|---|---|
| CN | 210073860 U | 2/2020 |
| KR | 20070089544 A | 8/2007 |

OTHER PUBLICATIONS

International Search Report (ISR) in Application No. PCT/CN2021/082650, dated Jun. 30, 2021.

* cited by examiner

ANTI-FUSE DEVICES AND ANTI-FUSE UNITS

CROSS-REFERENCE TO RELATED APPLICATIONS

This application is a national stage of International Application No. PCT/CN2021/082650 filed on Mar. 24, 2021, which claims priority to Chinese Patent Application No. 202010268401.0 filed on Apr. 8, 2020. The disclosures of these applications are hereby incorporated by reference in their entirety.

TECHNICAL FIELD

The present disclosure relates to an anti-fuse device and an anti-fuse unit.

BACKGROUND

A DRAM chip usually has redundant storage units which may be used to, when the DRAM chip has defective storage units, replace the defective storage units to repair the DRAM. When repairing the DRAM chip, one-time programmable (OTP) devices, for example anti-fuse units, are used.

SUMMARY

According to various embodiments, a first aspect of the present disclosure provides an anti-fuse device, comprising:
a substrate;
an anti-fuse gate, partially embedded in the substrate, a portion of the anti-fuse gate embedded in the substrate having one or more sharp corners; and
an anti-fuse gate oxide layer, located between the anti-fuse gate and the substrate.

According to various embodiments, a second aspect of the present disclosure provides an anti-fuse unit, comprising:
an anti-fuse device described above; and
a transistor, located at a side of the anti-fuse gate away from the shallow trench isolation structure, the transistor having a source doped region and a drain doped region, the source doped region or the drain doped region being electrically connected to the anti-fuse device.

The details of one or more embodiments of the present disclosure will be set forth in the following drawings and description. Other features and advantages of the present disclosure will become apparent from the description, drawings and claims.

BRIEF DESCRIPTION OF THE DRAWINGS

In order to explain technical solutions of embodiments of the present disclosure more clearly, the accompanying drawings to be used in the embodiments will be introduced simply. Apparently, the accompanying drawings to be described below are merely some embodiments of the present disclosure. A person of ordinary skill in the art may obtain other drawings according to these drawings without paying any creative effort.

DETAILED DESCRIPTION

Figure 1:
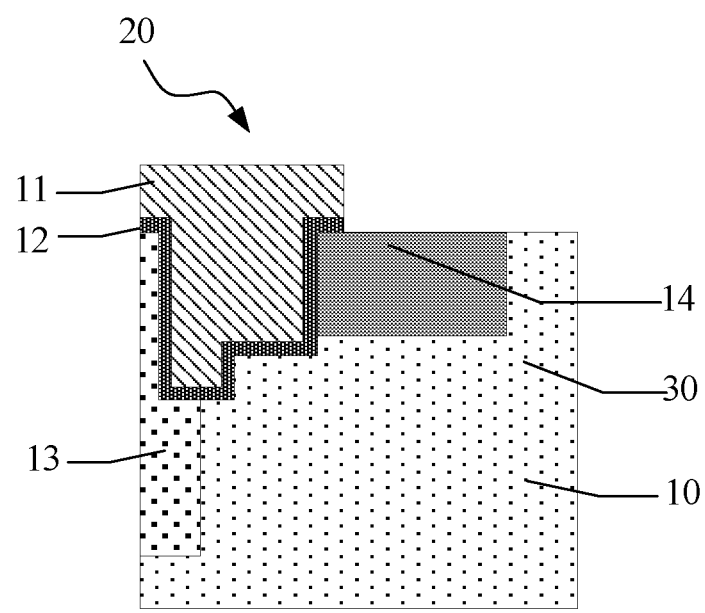
FIG. 1 is a schematic structure diagram of an anti-fuse device according to an embodiment of the present disclosure.

In the prior art, the breakdown of the anti-fuse device is unstable. When the gate is connected to a breakdown voltage, some products may not be broken down. This affects the product yield.

In order to facilitate the understanding of the present disclosure, the present disclosure will be described more fully below with reference to the relevant drawings. Preferred embodiments of the present disclosure are shown in the drawings. However, the present disclosure may be implemented in many different forms and is not limited to the embodiments described herein. On the contrary, these embodiments are provided to make the disclosure of the present disclosure more thorough and comprehensive.

Unless otherwise defined, all technical and scientific terms used herein have the same meaning as commonly understood by a person of ordinary skill in the art to which the present disclosure belongs. Here, terms used in the description of the present disclosure are merely intended to describe specific embodiments, rather than limiting the present disclosure. As used herein, the term "and/or" includes any or all of one or more associated listed items or combinations thereof.

In the description of the present disclosure, it should be understood that orientations or location relationships indicated by terms such as "upper", "lower", "vertical", "horizontal", "inner", "outer" are the directions and the location relationships illustrated on the basis of the drawings, and used just for convenience of describing the present disclosure and simplifying the description, rather than indicating or implying that the devices or elements must have a specific orientation and be constructed and operated in the specific orientation, and therefore shall not be considered as any limitations to the present disclosure.

As shown in FIG. 1, the present disclosure provides an anti-fuse device. The anti-fuse device 20 comprises a substrate 10, an anti-fuse gate 11, and an anti-fuse gate oxide layer 12. The anti-fuse gate 11 is partially embedded in the substrate 10, and the portion of the anti-fuse gate 11 embedded in the substrate 10 has a sharp corner. The anti-fuse gate oxide layer 12 is located between the anti-fuse gate 11 and the substrate 10. Therefore, the gate oxide layer is also embedded in the substrate 10 and has a sharp corner. The thickness of the gate oxide layer 12 at the sharp corner is less than the thickness of the anti-fuse gate oxide layer 12 at a non-sharp corner. The sharp corner may cause point discharge, so the gate oxide layer 12 at the sharp corner is more likely to be broken down.

In an optional embodiment, the substrate 10 further has a shallow trench isolation structure 13. The anti-fuse gate 11 is embedded in both the substrate 10 and the shallow trench isolation structure 13. This may be formed by the following process: forming a mask layer on the upper surface of the substrate 10 by spin-coating and patterning the mask layer, wherein part of the substrate 10 and part of the shallow trench isolation structure 13 are exposed from the patterned mask layer; etching the exposed part of the substrate 10 and part of the shallow trench isolation structure 13 to form a groove, wherein, due to different etching selectivity of the substrate 10 and the shallow trench isolation structure 13, the shallow trench isolation structure 13 is etched deeper than the substrate 10, so the groove has a shape corner at the intersection of the shallow trench isolation structure 13 and the substrate 10; and forming an anti-fuse gate oxide layer 12 on the inner wall of the groove and the surface of the substrate 10 and depositing an anti-fuse gate 11, wherein the anti-fuse gate 11 fills the groove. The anti-fuse gate 11 and the anti-fuse gate oxide layer 12 obtained in this way have sharp corners inside the substrate 10, and the number of sharp corners may be not less than 2. Due to the multiple breakdown points, the uniformity of the anti-fuse devices 20 produced in the same batch is better, and the consistency of the performance of products in a batch is improved. In an optional embodiment, the sharp angle may be a right angle or an obtuse angle.

In an optional embodiment, the depth of the anti-fuse gate 11 embedded in the shallow trench isolation structure 13 is greater than the depth of the anti-fuse gate 11 embedded in the substrate 10. In this way, the contact area of the anti-fuse gate oxide layer 12 with the substrate 10 is larger, which increases the effective area of the anti-fuse gate oxide layer 12. Since the effective area of the bent anti-fuse gate oxide layer 12 is larger, the anti-fuse device 20 in a smaller size can still have a sufficient area of the anti-fuse gate oxide layer 12. It is beneficial to the miniaturization of the anti-fuse device 20.

In an optional embodiment, the thickness of the anti-fuse gate oxide layer 12 at the sharp corner is less than the thickness of the anti-fuse gate oxide layer 12 at a non-sharp corner. Controlling the oxygen concentration and the reaction area during the formation process ensures a smaller area of the anti-fuse layer at the sharp corner. The smaller thickness of the anti-fuse gate oxide layer 12 at the sharp corner is more conducive to the breakdown of the anti-fuse gate oxide layer 12 by point discharge.

In an optional embodiment, the anti-fuse device 20 further comprises a heavily doped region 14 located in the substrate 10 and located at a side of the anti-fuse gate 11 away from the shallow trench isolation structure 13. The heavily doped region 14 enables the anti-fuse device 20 more likely to be broken down.

Figure 2:
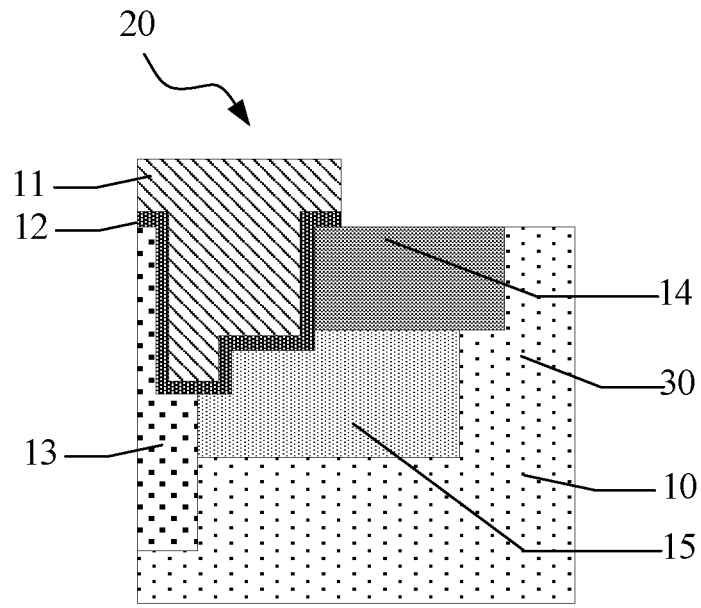
FIG. 2 is a schematic structure diagram of an anti-fuse device according to another embodiment of the present disclosure.

As shown in FIG. 2, in other optional embodiments, the anti-fuse device 20 further comprises an anti-fuse implantation region 15 located in the substrate 10, the anti-fuse implantation region 15 coating the portion of the anti-fuse gate 11 embedded in the substrate 10. The anti-fuse device 20 coated by the anti-fuse implantation region 15 is more likely to be broken down. Meanwhile, by controlling the doping concentration of the anti-fuse implantation region 15, the breakdown voltage of the anti-fuse device 20 may be controlled. Specifically, the greater the doping concentration of the anti-fuse implantation region 15 is, the lower the breakdown voltage of the anti-fuse device 20 is. The two have a negative correlation. In an optional embodiment, the anti-fuse implantation region 15 also coats the heavily doped region 14. In an embodiment, the heavily doped region 14 and the anti-fuse implantation region 15 are both N-type doped, both of which may be formed by ion implantation.

Figure 3:
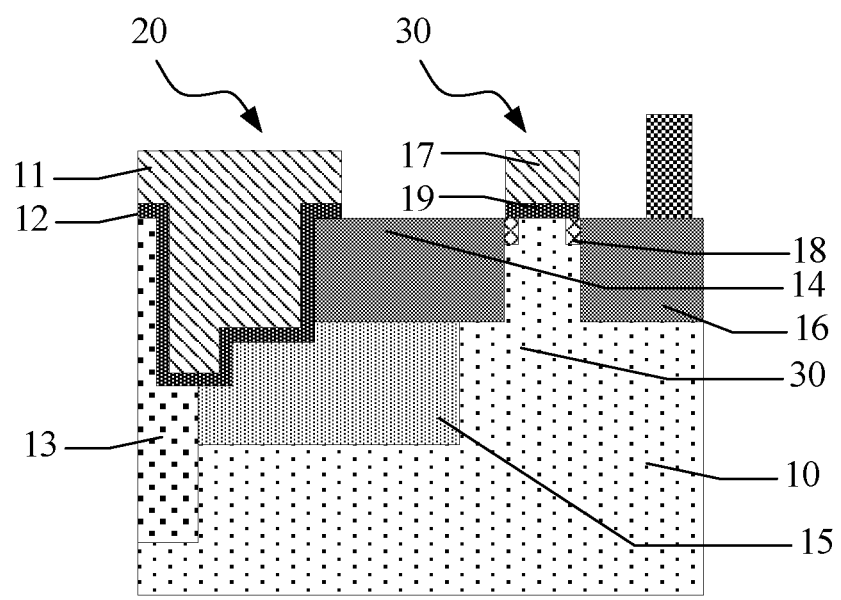
FIG. 3 is a structure diagram of an anti-fuse unit in an embodiment of the present disclosure.

As shown in FIG. 3, the present disclosure further provides an anti-fuse unit. The anti-fuse unit comprises the anti-fuse device 20 and the transistor 30 in the above embodiment, wherein the transistor 30 is located at a side of the anti-fuse gate 11 away from the shallow trench isolation structure 13; the transistor 30 has a source doped region, a drain doped region 16, a gate 17 and a gate oxide layer 19; and the source doped region is electrically connected to the anti-fuse device 20.

In an optional embodiment, the thickness of the anti-fuse gate oxide layer 12 is less than or equal to the thickness of the gate oxide layer 19 of the transistor 30.

In an optional embodiment, the source doped region and the heavily doped region 14 at least partially overlap, as shown in FIG. 3. In an embodiment, the source doped region of the transistor 30 and the heavily doped region 14 overlap. Specifically, the source doped region of the transistor 30 may be the same region as the heavily doped region 14. Of course, in other examples, it may be possible that the drain doped region of the transistor 30 and the heavily doped region 14 overlap. In this case, the source doped region is located at a side of the gate 17 away from the anti-fuse device 20.

In an optional embodiment, as shown in FIG. 3, the lightly doped drain structure 18 is formed at both the periphery of the drain doped region 16 of the transistor 30 and the periphery of the heavily doped region 14.

Figure 4:
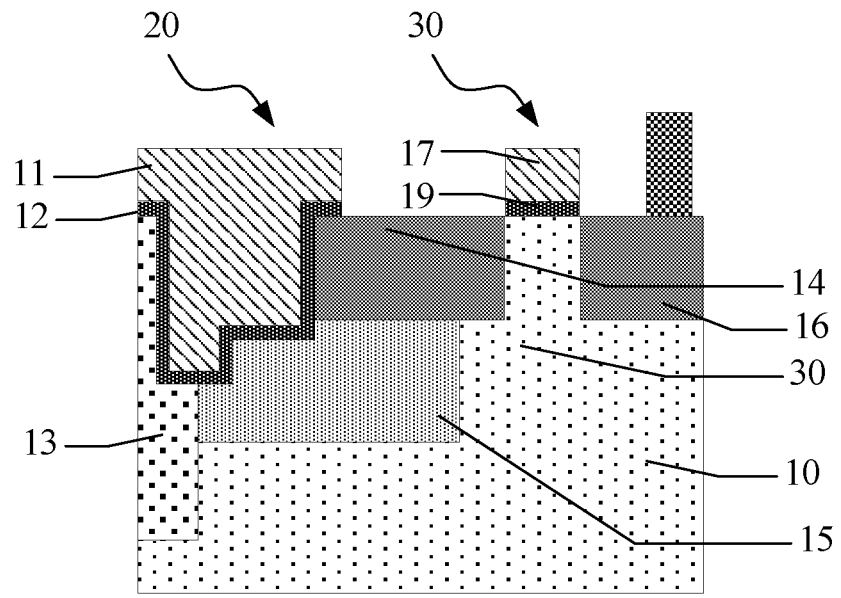
FIG. 4 is a structure diagram of an anti-fuse unit in other optional embodiments of the present disclosure.

In another optional embodiment, as shown in FIG. 4, the lightly doped drain structure 18 is not formed at both the periphery of the drain doped region 16 of the transistor 30 and the periphery of the heavily doped region 14.

Figure 5:
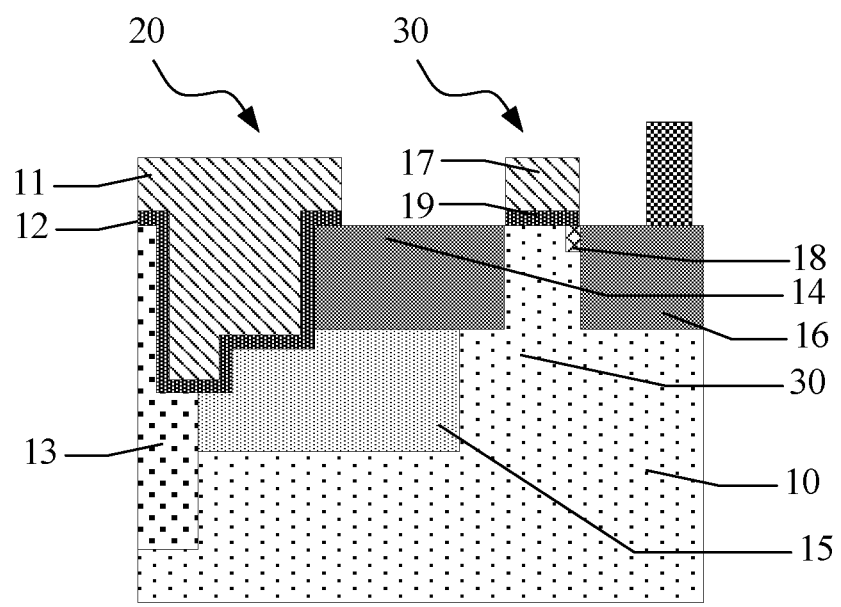
FIG. 5 is a structure diagram of an anti-fuse unit in another embodiment of the present disclosure,
in which:
10: substrate; 11: anti-fuse gate; 12: anti-fuse gate oxide layer; 13: shallow trench isolation structure; 14: heavily doped area; 15: anti-fuse implantation region; 16: drain doped region; 17: gate; 18: lightly doped drain structure; 19: gate oxide layer; 20: anti-fuse device; and 30: transistor.

In still another optional embodiment, as shown in FIG. 5, the periphery of the heavily doped region 14 does not have the lightly doped drain structure 18, and the edge of the drain doped region 16 of the transistor 30 has the lightly doped drain structure 18, so that the transistor 30 is an asymmetrical transistor 30. The two sides of the gate are asymmetrical, and the resistance on the side without the lightly doped drain structure 18 is lower. In an embodiment, the lightly doped drain structure 18 may be located only at a side of the drain doped region 16 close to the gate 17. The lightly doped drain structure 18 makes the breakdown voltage of the drain doped region 16 in the vertical direction higher. The upper surface of the lightly doped drain structure 18 is flush with the upper surface of the drain doped region 16, and the lower surface thereof is higher than the lower surface of the drain doped region 16. This reduces the rise of resistance caused by the lightly doped drain structure 18.

Of course, in other examples, the lightly doped drain structure 18 may be located only at a side of the heavily doped region 14 close to the gate 17.

In conclusion, in the anti-fuse device 20 of the present disclosure, the anti-fuse gate 11 and the anti-fuse gate oxide layer 12 have sharp corners in the substrate 10, so that the anti-fuse device 20 is easier to be broken down due to multiple point discharge locations. With multiple breakdown points, the uniformity of the anti-fuse devices 20 produced in the same batch is better, and the consistency of the performance of products in a batch is improved. Since the effective area of the bent anti-fuse gate oxide layer 12 is larger, the anti-fuse device 20 in a smaller size can still have a sufficient area of the anti-fuse gate oxide layer 12. It is beneficial to the miniaturization of the anti-fuse device 20.

Various technical features of the above embodiments can be arbitrarily combined. For simplicity, not all possible combinations of various technical features of the above embodiments are described. However, all those technical features shall be included in the protection scope of the present disclosure if not conflict.

The embodiments described above merely represent certain implementations of the present disclosure. Although those embodiments are described in more specific details, it is not to be construed as any limitation to the scope of the present disclosure. It should be noted that, for a person of ordinary skill in the art, a number of variations and improvements may be made without departing from the concept of the present disclosure, and those variations and improvements should be regarded as falling into the protection scope of the present disclosure. Therefore, the protection scope of the present disclosure should be subject to the appended claims.

What is claimed is:

1. An anti-fuse device, comprising:
   a substrate;
   an anti-fuse gate, partially embedded in the substrate, a portion of the anti-fuse gate embedded in the substrate having one or more sharp corners; and
   an anti-fuse gate oxide layer, located between the anti-fuse gate and the substrate.

2. The anti-fuse device according to claim 1, wherein the substrate further has a shallow trench isolation structure, and the anti-fuse gate is embedded in both the substrate and the shallow trench isolation structure.

3. The anti-fuse device according to claim 2, wherein a depth of the anti-fuse gate embedded in the shallow trench isolation structure is greater than a depth of the anti-fuse gate embedded in the substrate.

4. The anti-fuse device according to claim 3, wherein the sharp corner is a right angle or an obtuse angle.

5. The anti-fuse device according to claim 4, wherein a thickness of the anti-fuse gate oxide layer at the sharp corner is less than a thickness of the anti-fuse gate oxide layer at a non-sharp corner.

6. The anti-fuse device according to claim 2, wherein the anti-fuse device further comprises a heavily doped region located in the substrate and located at a side of the anti-fuse gate away from the shallow trench isolation structure.

7. The anti-fuse device according to claim 6, wherein the anti-fuse device further comprises an anti-fuse implantation region located in the substrate, the anti-fuse implantation region coating the portion of the anti-fuse gate embedded in the substrate and coating the heavily doped region.

8. The anti-fuse device according to claim 6, wherein the heavily doped region and the anti-fuse implantation region are both N-type doped.

9. An anti-fuse unit, comprising:
   an anti-fuse device according to claim 6; and
   a transistor, located at a side of the anti-fuse gate away from the shallow trench isolation structure, the transistor having a source doped region and a drain doped region, the source doped region or the drain doped region being electrically connected to the anti-fuse device.

10. The anti-fuse unit according to claim 9, wherein the source doped region or the drain doped region at least partially overlaps the heavily doped region.

11. The anti-fuse unit according to claim 10, wherein the transistor is an asymmetric transistor, and there is no lightly doped drain structure at a side of a partially overlapping region of the transistor.

12. The anti-fuse unit according to claim 10, wherein the thickness of the anti-fuse gate oxide layer is less than or equal to a thickness of a gate oxide layer of the transistor.

13. The anti-fuse unit according to claim 9, wherein a lightly doped drain structure is formed at both a periphery of the drain doped region of the transistor and a periphery of the heavily doped region.

14. The anti-fuse unit according to claim 9, wherein a lightly doped drain structure is not formed at both a periphery of the drain doped region of the transistor and a periphery of the heavily doped region.

15. The anti-fuse unit according to claim 9, wherein a periphery of the heavily doped region does not have a lightly doped drain structure and an edge of the drain doped region of the transistor has a lightly doped drain structure.

16. The anti-fuse unit according to claim 9, wherein a lightly doped drain structure is located only at a side of the drain doped region close to a gate.

17. The anti-fuse unit according to claim 15, wherein an upper surface of the lightly doped drain structure is flush with an upper surface of the drain doped region, and a lower surface of the lightly doped drain structure is higher than a lower surface of the drain doped region.

18. The anti-fuse unit according to claim 9, wherein a lightly doped drain structure is located only at a side of the heavily doped region close to a gate.

* * * * *